(12) United States Patent
Bergemont et al.

(10) Patent No.: US 7,535,758 B2
(45) Date of Patent: May 19, 2009

(54) ONE OR MULTIPLE-TIMES PROGRAMMABLE DEVICE

(75) Inventors: Albert Bergemont, Palo Alto, CA (US); David Kuan-Yu Liu, Fremont, CA (US); Venkatraman Prabhakar, Pleasanton, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 175 days.

(21) Appl. No.: 11/703,922

(22) Filed: Feb. 6, 2007

(65) Prior Publication Data

US 2008/0186773 A1    Aug. 7, 2008

(51) Int. Cl.
G11C 16/04    (2006.01)
(52) U.S. Cl. .................... 365/185.01; 365/94; 257/315
(58) Field of Classification Search ............ 365/185.01, 365/94; 257/314, 315
See application file for complete search history.

(56) References Cited

U.S. PATENT DOCUMENTS 5,723,888 A    3/1998    Yu 6,687,156 B2 *    2/2004    Kobayashi et al. ..... 365/185.01
2005/0026365 A1    2/2005    Ding

FOREIGN PATENT DOCUMENTS

EP          0 739 041 A2    1/1990
WO          WO 94/15363      7/1994

* cited by examiner

Primary Examiner—Huan Hoang
(74) Attorney, Agent, or Firm—Mintz, Levin, Cohn, Ferris, Glovsky and Popeo P.C.

(57) ABSTRACT

Methods and apparatus, including computer program products, for a one or multiple-times programmable memory device. A semiconductor may include an active region of a substrate, a thin oxide layer over a substrate, a first and second polysilicon layer, and a first and second metal layer. The first polysilicon layer may have a floating gate, the active region may be substantially perpendicular to the floating gate, and the second polysilicon layer may include a control gate. The first metal layer may include a bit line connected to a first n-diffused region, where the bit line is substantially perpendicular to the floating gate. The second metal layer may include a word line and source line. The word line may be connected to the control gate, and the source line may be connected to a second n-diffused region. The thin gate oxide may have a thickness between 65 and 75 angstroms.

17 Claims, 6 Drawing Sheets

CHE Programming

|        | BL1 | WL1 | Vss1 | BL2 | WL2 | Vss2  |
|--------|-----|-----|------|-----|-----|-------|
| Prog A | Vpp | Vpp | Vss  |     |     |       |
| Inh B  |     | Vpp | Vss  | Vss |     |       |
| Inh C  | Vpp |     |      |     | Vss | Vpp/2 |
| Inh D  |     |     |      | Vss | Vpp | Vpp/2 |

CHH Programming

|  | BL1 | WL1 | Vss1 | BL2 | WL2 | Vss2 |
|---|---|---|---|---|---|---|
| Prog A | Vpp | Vss | Vss |  |  |  |
| Inh B |  | Vss | Vss | Vss |  |  |
| Inh C | Vpp |  |  |  | Vpp | Vss |
| Inh D |  |  |  | Vss | Vpp | Vss |

ONE OR MULTIPLE-TIMES PROGRAMMABLE DEVICE

BACKGROUND

The present disclosure relates to data processing by digital computer and digital circuitry, and more particularly to a one or multiple-times programmable device.

In general, different types of memory devices may have different characteristics related to programming the memory devices. For example, some memory devices may have properties that make a device only programmable once (e.g., a memory device may be programmed by fusing of a structure through a process that might not be reversible) while other memory devices may be programmable many times.

To program memory cells of programmable memory devices, a special voltage, referred to as a programming voltage, may be applied to a floating and control gate of a transistor of a memory cell. The programming voltage may be higher than a voltage used to a read content of the memory device, such that a charge may be held by a memory cell. A high voltage may be required due to a thick oxide used to ensure a device may be programmable many times (e.g., a flash memory application in a digital music player may require many program/erase cycles).

SUMMARY

The subject matter disclosed herein provides methods and apparatus, including memory devices and computer program products, that implement techniques related to a one or multiple-times programmable device.

In one aspect, a semiconductor may include an active region of a substrate, a thin oxide layer over a substrate, a first and second polysilicon layer, and a first and second metal layer. The first polysilicon layer may have a floating gate being a substantially rectangular area. A longer portion of the active region may be substantially perpendicular to the floating gate. The second polysilicon layer may include a control gate. The first metal layer may include a bit line electrically connected to a first n-diffused region of the active region, where the bit line is substantially perpendicular to the floating gate. The second metal layer may include a word line and source line. The word line may be electrically connected to the control gate, and the source line may be electrically connected to a second n-diffused region of the active region.

In another interrelated aspect, a memory cell of a programmable device may be programmed by applying a programming voltage to a bit line and word line of the memory cell, and applying a source voltage to the source line, where the programming voltage is substantially 5 volts, the source voltage is substantially zero volts, and the memory cell is an n-channel device having a thin gate oxide and two polysilicon layers. A first polysilicon layer may define a floating gate and a second polysilicon layer may define at least one control gate.

In another interrelated aspect, a memory cell of a programmable device may be programmed by performing bipolar injection to reset the memory cell of the programmable device and performing channel hot hole programming to program the memory cell. The memory cell may be an n-channel device having a thin gate oxide and two polysilicon layers, with a first of the two polysilicon layers defining a floating gate and a second of the two polysilicon layers defining a control gate.

The subject matter may be implemented as, for example, computer program products (e.g., as source code or compiled code), computer-implemented methods (e.g., methods of manufacturing semiconductor devices), memory devices, memory control devices, and systems.

Variations may include one or more of the following features.

A semiconductor may be a memory cell of a memory device. The semiconductor may be manufactured by forming the various layers. For example, the polysilicon layers may be formed by depositing polysilicon and etching features. A thin gate oxide may have a thickness less than 75 angstroms. A thin gate oxide may have a thickness between 65 and 75 angstroms, such as a thickness of 70 angstroms.

The memory cell may be a one-time or multiple-times programmable device. A multiple-times programmable device may have a program and erase cycling endurance of less than 500 cycles.

The memory cell may further include a deep n-well and a p-well in the substrate. The deep n-well and p-well may encompass the first and second diffused regions.

The second polysilicon layer may include two control gates, each which is substantially situated above ends of the floating gate.

The first metal layer may further include landing pads with a first landing pad between the word line and control gate, and a second landing pad between the source line and active region.

The active region may have a transposed-L shape from a first view above the substrate. The floating gate may have a dumbbell shape with larger ends of the shape situated below control gates of the second polysilicon layer.

Bipolar injection may be performed at a voltage of substantially 5 volts and channel hot hole programming may be performed at a voltage of substantially 5 volts. Bipolar injection may include applying a voltage of substantially 5 volts to a bit line and source line of the memory cell.

Programming of adjacent memory cells may be inhibited by applying the source voltage to an adjacent bit line and an adjacent word line, and applying substantially half the programming voltage to an adjacent source line.

A programming voltage may be between 4.5 and 6 volts (e.g., it may be 5 volts).

The subject matter described herein can be implemented to realize one or more of the following advantages. EPROM-like functionality may be achieved without introducing extra cost associated with a thicker gate oxide, as a thin gate oxide may be used for a one or multiple-times programmable device. A voltage for programming or resetting the memory cell (e.g., as part of erasing a memory device) may be substantially five volts, which may be significantly less than seven volts required for other techniques for programming or resetting a memory cell. As such a device may be programmed with five volts or less, the need to generate high voltage support for transistors on-chip during manufacturing is reduced or eliminated; which may reduce manufacturing cost (e.g., as a thin gate oxide that allows for a five volt or less programming voltage may be less expensive to manufacture than a thicker gate oxide). An n-channel device may be used, which may reduce costs associated with manufacture of p-channel devices (e.g., licensing of p-channel technologies). Hot hole injection may be used which may be preferable to hot electron injection due to a poor drain coupling to a floating gate.

Details of one or more implementations are set forth in the accompanying drawings and in the description below. Further features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
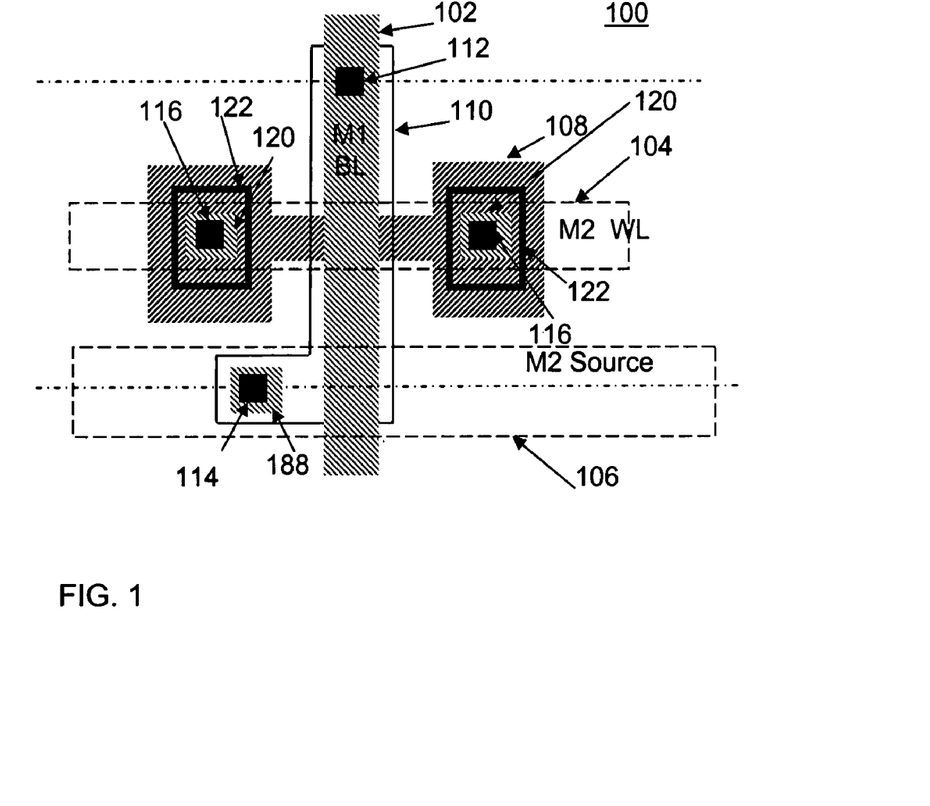
FIG. 1 is a diagram illustrating a top-down view of a memory cell of a memory device.

FIG. 1 is a diagram illustrating a top-down view of a memory cell 100 of a memory device. The memory cell 100 may be used in a one or multiple-times programmable memory device and may store one bit of information. For example, in a one-time programmable scenario the memory cell 100 may provide one-time programmable EPROM (erasable programmable read only memory) functionality. Or, in a multiple-times programmable scenario, the memory cell 100 may provide EPROM functionality that allows for multiple program/erase cycles. In a multiple-times programmable scenario, the memory cell 100 may have characteristics that allow for tens or hundreds of program/erase cycles. In some implementations, device characteristics may prevent higher than several hundred program/erase cycles (e.g., thousands of program/erase cycles might lead to an unstable or unreliable memory device).

In general, the memory cell 100 includes a bit line 102, word line 104, and source line 106. The bit line 102, word line 104, and source line 106 allow for programming and reading of the memory cell 100. For example, the memory cell 100 may be programmed using channel hot electron programming by applying a programming voltage to the bit line 102 and word line 104 and applying a source voltage to the source line 106 (as will be described in greater detail with reference to FIGS. 4A and 4B). As another example, the memory cell may be read by applying voltages to the bit line 102 and word line 104 that are lower than the programming voltage.

In addition to the bit line 102, word line 104, and source line 106, the memory cell 100 includes control gates 122, a floating gate 108, an active region 110, a bit line contact 112, a source line contact 114, and word line vias/contacts 116.

The memory cell 100 includes four layers of metal or polysilicon that rest above a substrate. The four layers include a first polysilicon layer, a second polysilicon layer, a first metal layer, and a second metal layer. The different layers are used to define features of the memory cell 100. For example, the first polysilicon layer is used to define the floating gate 108 which is generally shaped as a dumbbell and is orientated substantially perpendicular to the bit line 102. As another example, the second polysilicon layer is used to define control gates 122. As another example, the first metal layer may define the bit line 102 and landing pads 120, 188. As another example, the second metal layer may define the word line 104 and source line 106.

An oxide layer (e.g., SiO2) rests between each of the layers, and between layers and the substrate. For example, an oxide layer that defines a tunnel oxide region exists between the floating gate 108 and the substrate (not shown). The tunnel oxide layer may be a thin oxide layer of less than 100 angstroms, and, may be as thin as 65 and 75 angstroms (e.g., 70 angstroms). A thin oxide, such as a thin gate oxide, may allow for easier manufacturing methods to be implemented and may reduce cost of manufacturing a memory cell.

The control gates 122 are connected to the word line 104 and landing pads 120 thru word line vias/contacts 116 (e.g., a via between the word line 104 and landing pads 120, and a contact between the landing pads 120 and control gates 122). The active region 110 is patterned in a substrate and has diffused regions connected to the bit line 102 and source line 106. For example, the bit line contact 112 connects the bit line 102 with a diffused region of the active region 110. As another example, the source line contact 114 may connect to the landing pad 188 thru a via, and the landing pad 188 may be connected with a contact to a diffused region of the active region 110.

Although not shown, the memory cell 100 may be replicated multiple times to provide an array of memory cells in a memory device. For example, features of the memory cell may be replicated across the bit line 102 and the word line 104 to generate an array of memory cells.

FIGS. 2A-2D are block diagrams illustrating cross-sections of a memory cell of a memory device. All of the cross-sections are of a same memory cell, which may be the memory cell 100 of FIG. 1. In general, the cross-sections may include four layers of metal or polysilicon above a substrate, including a first polysilicon layer, a second polysilicon layer, a first metal layer, and a second metal layer. In some cross-sections the substrate may also include features, such as an isolation trench or diffused regions. Between each of the layers may be an oxide layer.

Figure 2A:
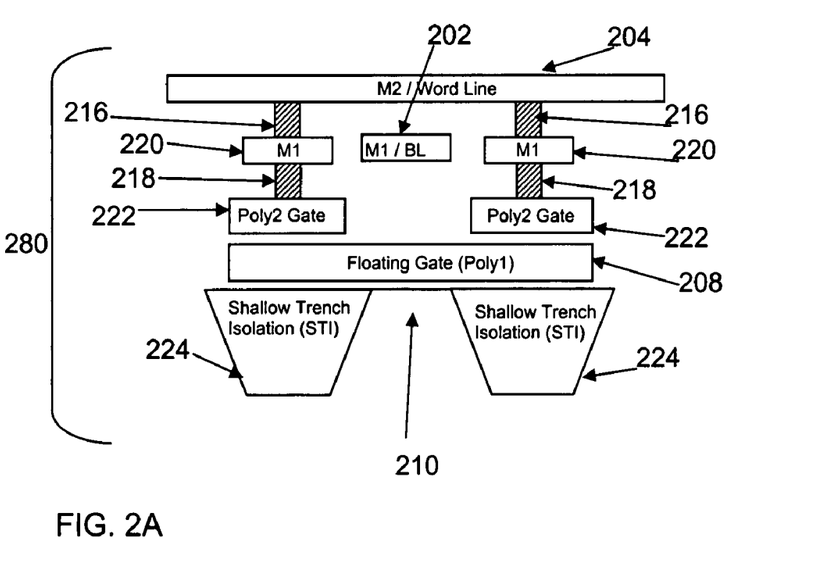
FIGS. 2A-2D are block diagrams illustrating cross-sections of a memory cell of a memory device.

The diagram of FIG. 2A shows a first cross-section 280 of a memory cell along a word line 204. For example, the cross-section 280 may be a cross-section along the word line 104 of FIG. 1. In general, the first polysilicon layer includes a floating gate 208, which may correspond to the floating gate 108 of FIG. 1. The second polysilicon layer includes control gates 222, which may correspond to control gates 122 of FIG. 1. A first metal layer may include landing pads 220 (between the word line 204 and control gates 222), and a bit line 202, which may correspond to the bit line 102 of FIG. 1. Between some of the first and second metal layers are vias 216, which provide an electrical connection between the word line 204 and the landing pads 220. Between the landing pads 220 and the control gates 222 are contacts 218, which provide an electrical connection between those layers. The substrate includes shallow trench isolation features 224 that act to isolate charge in the substrate, and an active region 210, which may correspond to the transposed L active region feature 110 of FIG. 1.

Figure 2B:
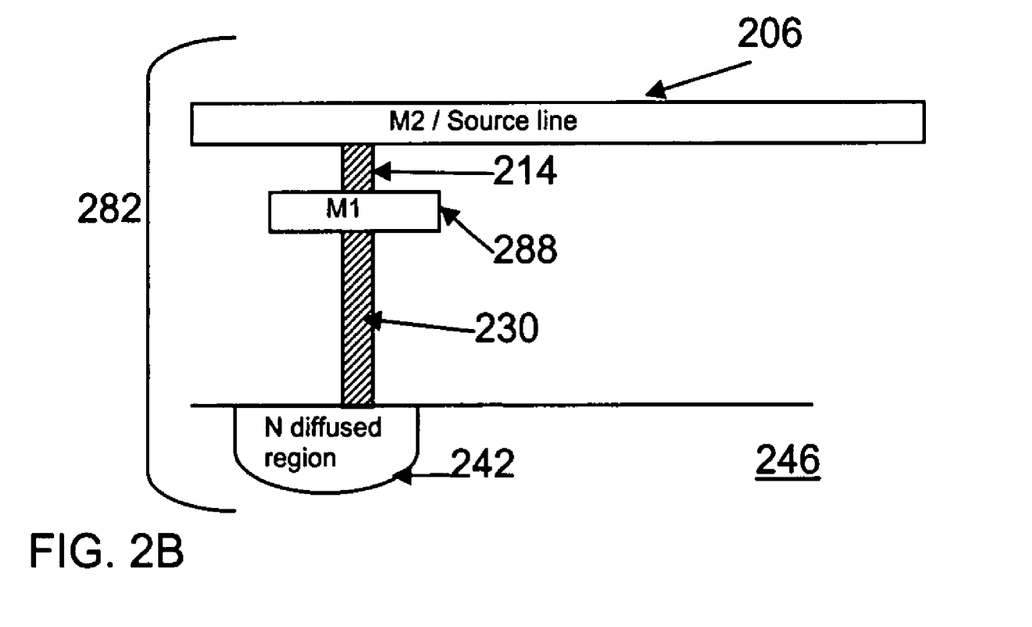

The diagram of FIG. 2B shows a second cross-section 282 of a memory cell along a source line 206. The source line 206 may be the source line 106 of the memory cell 100 of FIG. 1. Beneath the source line are a landing pad 288, an n-diffused region 242 of a substrate 246 (e.g., a diffused region of the active region 210 of FIG. 2A), a via 214, and a contact 230. The source line 206 is electrically connected to the landing pad 288 of the first metal layer through a via 214, and the landing pad 288 is electrically connected to the diffused region 242 of the substrate 246 by a contact 230.

Figure 2C:
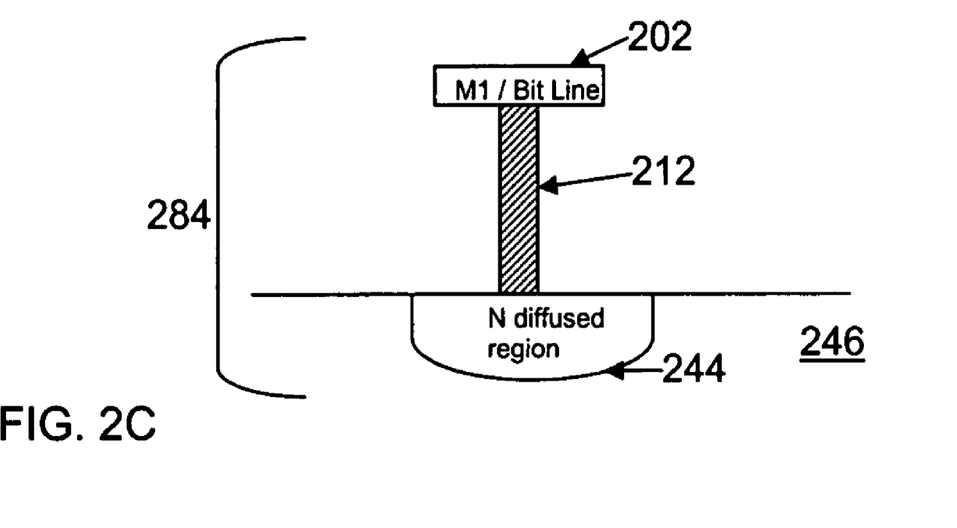

The diagram of FIG. 2C shows a third cross-section 284 of a memory cell at a contact between the bit line 202 and an n-diffused region 244 of the memory cell. The bit line 202 is electrically connected to the diffused region 244 of the substrate 246 by a contact 212.

Figure 2D:
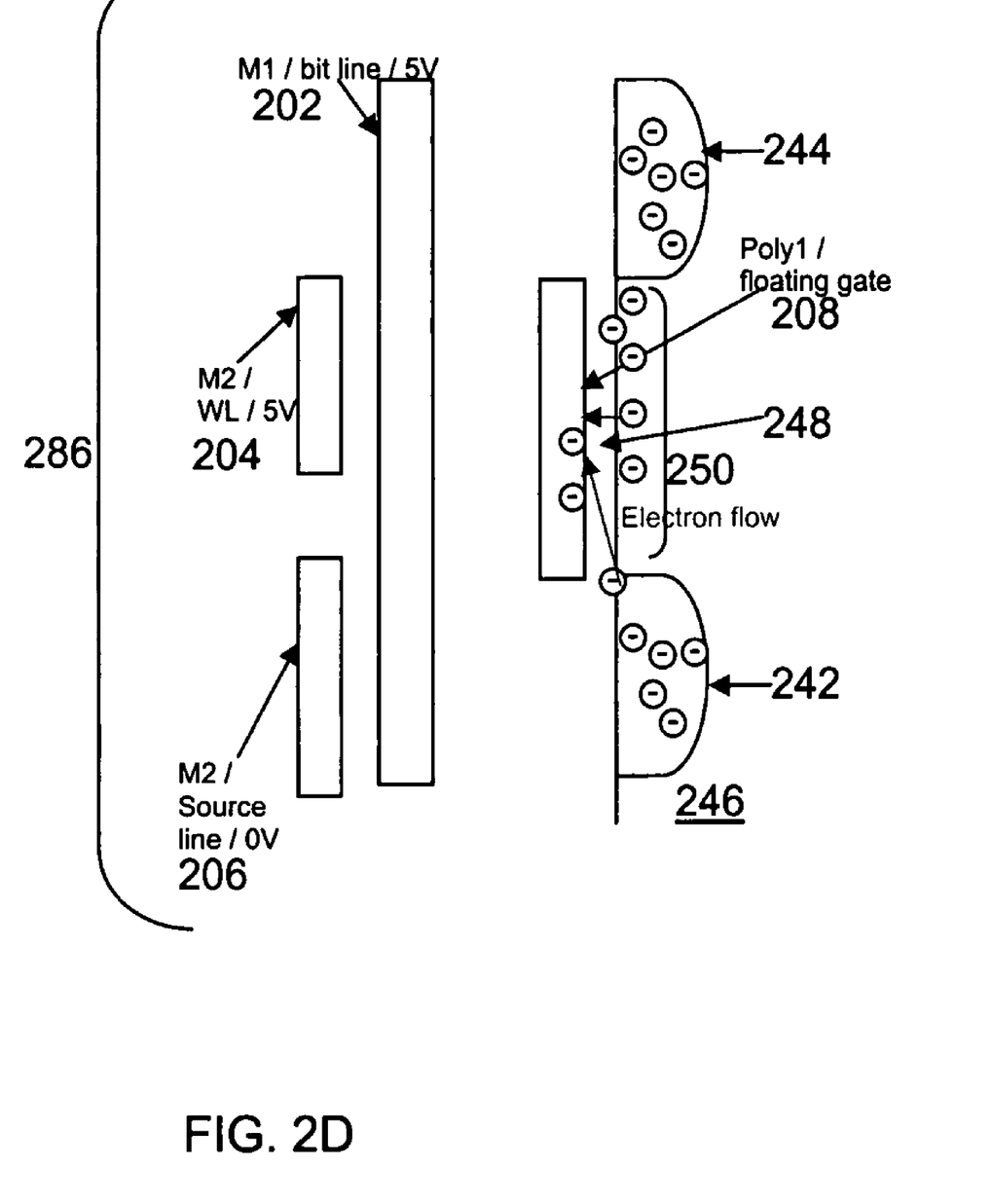

The diagram of FIG. 2D shows a fourth cross-section 286 of a memory cell along the bit line 202. For example, it may be a cross-section of the memory cell 100 of FIG. 1 along the bit line 102. The cross-section 286 illustrates a flow of electrons during channel hot electron programming of a memory cell, such as the memory cell 100 of FIG. 1.

The cross-section 286 includes the source line 206 above the bit line 202 (which are not electrically connected, although the source line is electrically connected to a portion of the first metal layer, which is not shown), the word line 204 above the bit line 202; the bit line 202 above the floating gate 208; and the n-diffused regions 242, 244 of the substrate 246. As shown in FIGS. 2B-2C, the n-diffused regions 242, 244 are electrically connected to the source and bit lines 206, 202. The cross-section 286 with the two n-diffused regions 242, 244 show how the memory cell of FIGS. 2A-2D forms an n-channel transistor.

The programming conditions for channel hot electron programming include applying a programming voltage of substantially five volts to both the bit line 202 and word line 204, and applying a source voltage of substantially zero volts to the source line 206. When these voltages are applied, an electron channel 250 is generated between the diffused regions 242, 244, the control gates 288 (not shown in cross-section 286, as they are on either side of the bit line) have a voltage difference with respect to the floating gate 208, and tunneling of electrons occurs across a tunnel oxide layer 248 such that the floating gate 208 is caused to hold electrons (e.g., electrons from the channel 250 may cross the thin oxide layer 248 and remain in the floating gate 208). Similarly, channel hot hole programming may be used to program the floating gate 208, as will be discussed in further detail below.

Figure 3:
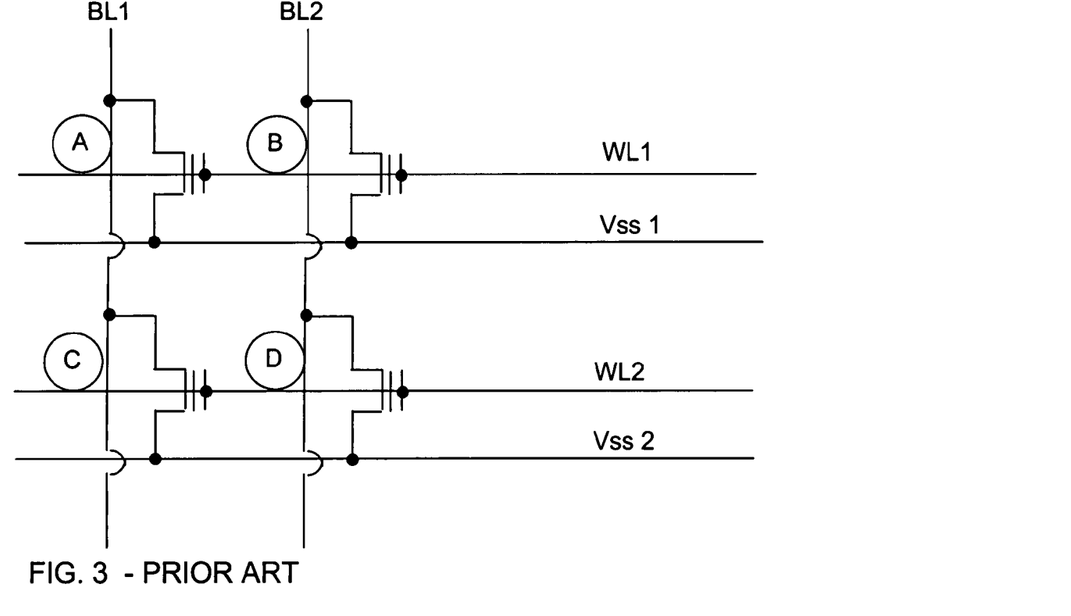
FIG. 3 is a diagram of an array of n-channel floating gate memory cells.

FIG. 3 is a diagram of an array of n-channel floating gate memory cells. The diagram illustrates a layout for memory cells A, B, C, D relative to each other, bit lines 1 and 2 (BL1, BL2), word lines 1 and 2 (WL1, WL2), and source lines 1 and 2 (Vss 1, Vss 2). The diagram will be used with reference to FIGS. 4A-4B and FIGS. 5A-5B to illustrate programming of memory cell A without interfering with contents of adjacent memory cells B, C, and D (e.g., a charge or lack of charge held by those memory cells), which may be referred to as inhibiting programming of memory cells B, C, and D. If memory cells B, C, or D are intended to be programmed in concert with the programming of memory cell A, different programming conditions may be used in accordance with the principles of the programming of memory cell A.

Figure 4A:
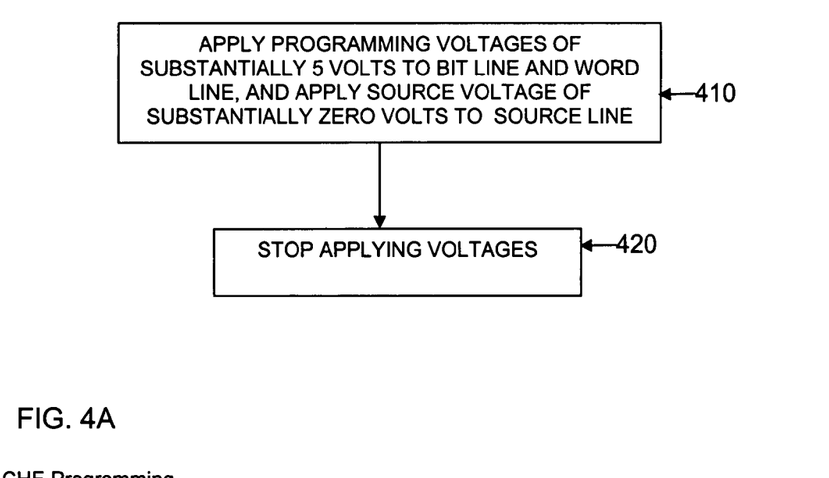
FIG. 4A is a flowchart illustrating a process of programming a memory device in accordance with a table of FIG. 4B.
Figure 4B:
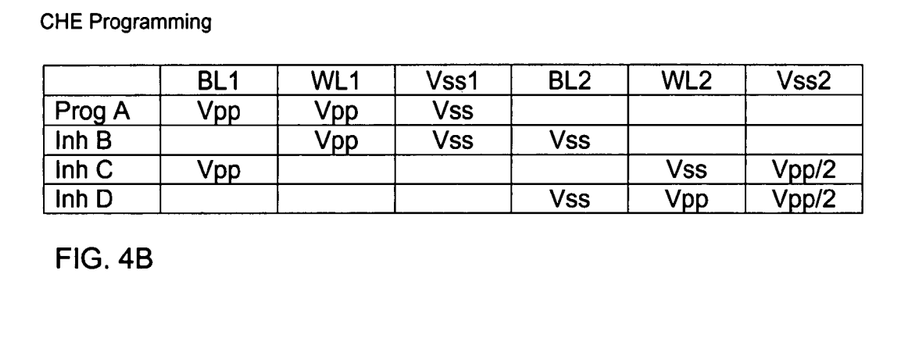

FIG. 4A is a flowchart illustrating a process of programming of a memory device in accordance with a table of FIG. 4B. In general, the flowchart involves channel hot electron programming of a memory cell, which may be the memory cell 100 of FIG. 1. To channel hot electron program the memory cell, a programming voltages of substantially five volts is applied to a bit line and word line of the memory cell, and a source voltage of substantially zero volts is applied to a source line of the memory cell (410). When the voltages are no longer applied (420), electrons are stored in a floating gate of the memory cell.

For example, to program memory cell A of FIG. 3 in accordance with the table of FIG. 4B, bit line 1 and word line 1 may have a programming voltage applied while a source voltage is applied to source line 1. To avoid affecting the contents of adjacent memory cells B, C, and D, different voltages may be applied to word line 2, bit line 2 and source line 2. For example, to inhibit programming of memory cell B, the bit line of that memory cell (bit line 2 of FIG. 3) may have the source voltage applied of substantially zero volts. As another example, to inhibit programming of memory cell C, the word line of memory cell C (word line 2 of FIG. 3) may have the source voltage applied of substantially zero volts and the source line of memory cell C (source line 2 of FIG. 3) may have half the programming voltage applied (e.g., substantially 2.5 volts). As another example, to inhibit programming of memory cell D, the source line of memory cell D may have half the programming voltage applied (e.g., substantially 2.5 volts) and the bit line of memory cell D (bit line 2 of FIG. 3) may have the source voltage of substantially zero volts applied. In general, as the adjacent memory cells may have voltages applied such that the difference across the floating gate and bit line of an adjacent memory cell is less than the programming voltage, no programming of the adjacent memory cell may occur.

As the memory cell 100 of FIG. 1 or the memory cell of FIGS. 2A-2D may have a thin gate oxide, a low programming voltage of substantially five volts may result in the programming of a memory cell in accordance with the programming conditions of FIG. 4B and in accordance with the process of FIG. 4A.

Figure 5A:
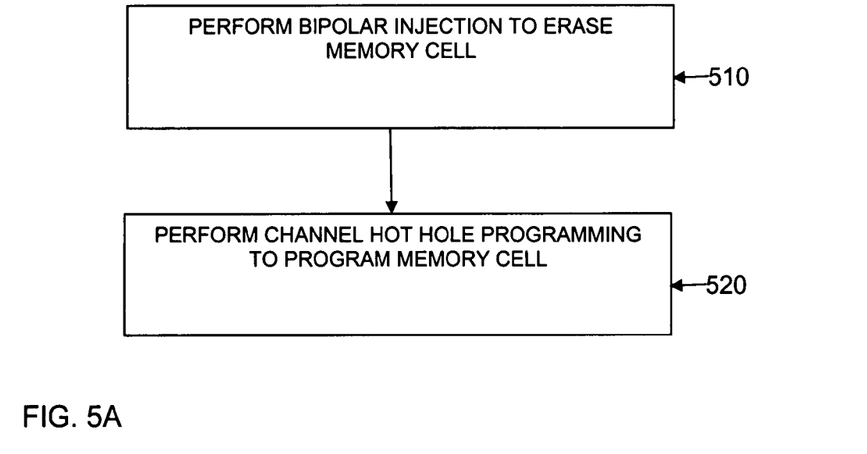
FIG. 5A is a flowchart illustrating a process of resetting and programming of a memory device in accordance with a bipolar injection process illustrated in FIG. 5B and a table of channel hot hole programming of FIG. 5C.
Figure 5B:
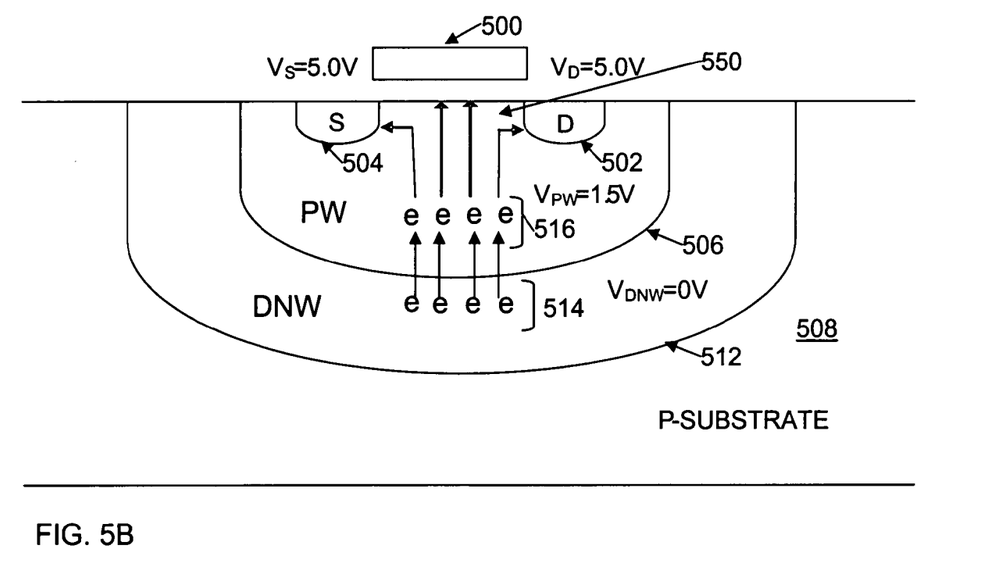
Figure 5C:
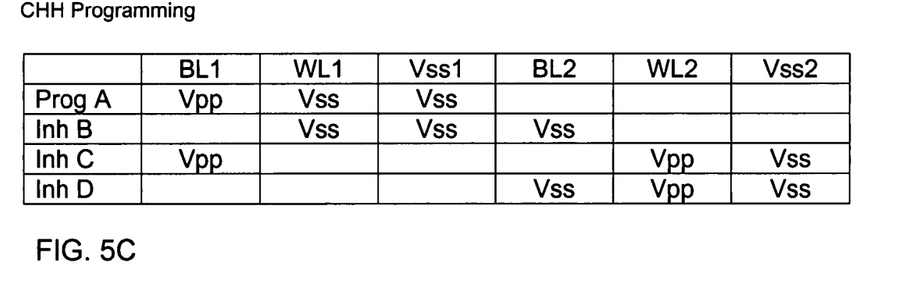

FIG. 5A is a flowchart illustrating a process of resetting and programming of a memory device in accordance with a bipolar injection process illustrated in FIG. 5B and a table of channel hot hole programming of FIG. 5C. In general, the process of FIG. 5A involves performing bipolar injection to erase a memory cell (510) and performing channel hot hole programming to program the memory cell (520). The process may be used to program an array of memory cells of a memory device. For example, an array of memory cells may be erased or reset using bipolar injection, and selected memory cells may be programmed using channel hot hole programming. The memory cell or memory cells that are erased and programmed may be the memory cell 100 of FIG. 1 or the memory cell of FIGS. 2A-2D. Erasing and programming a memory cell may be performed multiple times in accordance with the process of FIG. 5A to achieve a multiple-times programmable device.

FIG. 5B illustrates how bipolar injection may occur to a memory cell 500. The memory cell 500 may be the memory cell 100 of FIG. 1 or the memory cell of FIGS. 2A-2D. For example, a source region 504 may correspond to the n-diffused well 242 of FIG. 2D. To emphasize bipolar injection, the structure of the memory cell 500 is shown with little detail in FIG. 5B.

Bipolar injection involves applying voltages to both a drain 502 and source 504 of a memory cell to cause electrons to be attracted to a channel region 550 and injected into a floating gate, and cause a high threshold voltage state. As the drain 502 and source 504 may have a substantially higher voltage than a p-diffused well 506 of a substrate 508 and a surrounding deep n-diffused well 512, electrons 514 from the deep n-diffused well 512 may cross into the p-diffused well 506, and, electrons 516 of the p-diffused well may be attracted to the channel region 550 and be injected into the floating gate (e.g., with a positive control gate voltage; e.g., four or five volts; e.g., a voltage at least as great as the voltage of the source and drain to cause injection into the floating gate). This may cause the voltage of the floating gate to switch to a logical high, which may correspond to a reset state for an array of memory cells. The process may be referred to as bipolar injection due to an inherent p-well to n-well diode that exists in the memory cell 500 across the p-diffused well 506 and the n-diffused well 512, in conjunction with the source 502 and drain 506 being biased at a high voltage that results in an NPN bipolar transistor.

For example, a voltage of substantially five volts may be applied to, for example, the bit line 102 (e.g., drain) and source line 106 of FIG. 1, while a positive voltage is applied to the word line 104 (e.g., the control gate of the transistor). Were the memory cell 100 of FIG. 1 to have a deep n-diffused well having a lower voltage of an encompassed p-diffused well (e.g., similar to the n-diffused well 512 and p-diffused well 506 of FIG. 5), electrons may be attracted from the deep n-diffused well to the p-diffused well and to the channel region of the memory cell 100 of FIG. 1. And, electrons may be injected into the floating gate 108 of the memory cell 100 of FIG. 1. Thus, the memory cell 100 may reach a logical high state which may correspond to a reset condition. Also, the bipolar injection may be applied across many memory cells to generate a reset condition or a memory device.

To program the memory cell in accordance with the process of FIG. 5A, channel hot hole programming may be performed. The chart of FIG. 5C illustrates channel hot hole programming conditions to program a memory cell A and inhibit the programming of adjacent memory cells B, C, and D, in accordance with the layout of FIG. 3.

For example, memory cell A may have a programming voltage of substantially five volts applied to the bit line (bit line 1) and a source voltage of substantially zero volts may be applied to the word line and source line of memory cell A (word line 1, Vss 1). This may cause hot holes to be injected in the floating gate of memory cell A. As another example, to inhibit programming of memory cell B, an adjacent memory cell having a shared word line, memory cell B may have a source voltage of substantially zero volts applied to the word line, source line, and bit line of memory cell B (word line 1, Vss 1, bit line 2). As another example, to inhibit programming of memory cell C, an adjacent memory cell having a shared bit line, memory cell C may have a source voltage of substantially zero volts applied to its source line (source line 2), and a programming voltage of substantially five volts may be applied to the bit line and word line of memory cell C (bit line 1, word line 2). As another example, to inhibit programming of memory cell D, an adjacent memory cell having lines shared with other adjacent cells that are being inhibited, memory cell D may have a source voltage of substantially zero volts applied to its source line and bit line (source line 2, bit line 2), and a programming voltage of substantially five volts may be applied to its word line (word line 2).

Figure 6A:
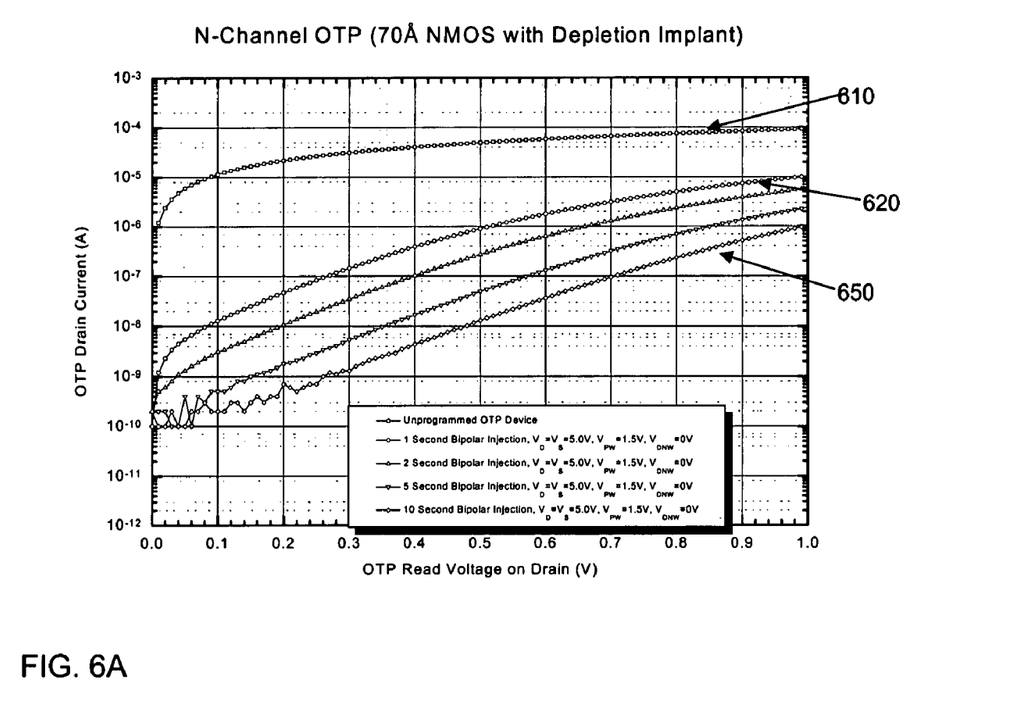
FIGS. 6A-6B are charts that illustrate results of bipolar injection of a memory cell.
Figure 6B:
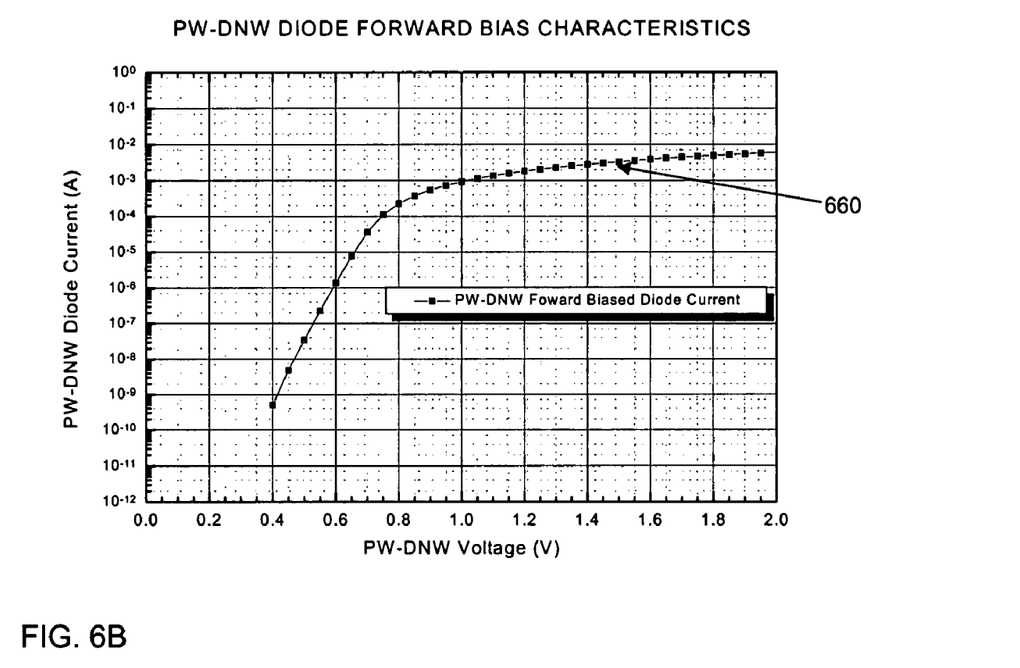

FIGS. 6A-6B are charts that illustrate results of bipolar injection of a memory cell. The memory cell may be any of the memory cells discussed above with reference to the other figures. In general, the memory cell has a deep n-diffused well surrounding a p-diffused well, as shown in FIG. 5, and having similar voltage bias conditions to the memory cell and substrate of FIG. 5. In particular, FIG. 6A shows read current as a function of programming time. Each line in the chart corresponds to a different amount of time to which a memory cell has been subject to a drain and source voltage of substantially five volts (and, potentially a positive gate voltage of about five volts). For example, a first line 610 corresponds to a memory cell that has not been subject to a drain and source voltage of substantially five volts. As another example, a second line 620 corresponds to a memory cell that has been subject to a drain and source voltage of substantially five volts for a period of substantially one second. In contrast to the first line 610, the second line 620 has a lower drain current at a read voltage of substantially 0.5 volts, as the drain current of the second line 620 at 0.5 volts is 1 microamp compared to the drain current of the first line 610 at 0.5 volts of 50 microamps. As a memory cell is subject to a drain and source voltage of substantially five volts for a longer period of time, such as ten seconds for a fifth line 650, the current drops to about 10 nanoamps for a read voltage of 0.5 volts. The drop in current may allow for the memory cell to become a suitable one-time programmable memory cell for channel hot hole programming. After programming, bipolar injection may be performed again to provide a multiple-times programmable device.

The bipolar current to forward-bias the p-well to n-well diode described in FIG. 5 is shown in FIG. 6B. The diode current is shown as a function of diode voltage for a p-well diode area of 993 square micrometers. When the diode voltage reaches 1.5V (e.g., which correspond to the diode conditions of FIG. 5), substantially 3 microamps for a square micrometer of diode area are consumed.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit). For example, the memory cell 100 of FIG. 1 may be programmed and read by a memory control logic device implemented in hardware or in software routines of a driver program.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To generate the memory cell of FIGS. 1, 2A-2D, or 5, common manufacturing (e.g., lithography and etch) processes may be used. For example, the active region 210 may be defined (e.g., by etching shallow trench isolation features). Then, first and second polysilicon layers may be deposited on the substrate 246 (e.g., layers to define the floating gate 208 and the control gates 222 may be deposited and then defined, e.g., thru etching). Then, diffused regions 242, 244 may be doped (e.g., thru masking/implanting ions). And, then, first and second metal layers may be deposited (e.g., the bit line 202 and source line 206 may be defined by physical vapor deposition and etching). If a deep n-well and p-well are to be included in a substrate 246 to encompass the diffused regions 242, 244 (e.g., for bipolar injection), these wells may be formed prior to defining the active region 210 (e.g., by ion implantation or diffusion).

The subject matter described herein has been described in terms of particular embodiments, but other embodiments can be implemented and are within the scope of the following claims. For example, operations can differ and still achieve desirable results. In certain implementations, multitasking and parallel processing may be preferable. Other embodiments are within the scope of the following claims

What is claimed is:

1. A method of manufacturing a semiconductor comprising:
    forming an active region of a substrate comprising a rectangular shape;
    forming a thin oxide layer over a substrate;
    forming a first polysilicon layer comprising a floating gate being a substantially rectangular area, a longer portion of the rectangular shape of the active region being substantially perpendicular to the floating gate;
    forming a second polysilicon layer comprising a control gate;
    forming a first metal layer comprising a bit line to be electrically connected to a first n-diffused region of the active region, the bit line being substantially perpendicular to the floating gate; and
    forming the second metal layer comprising a word line and source line, the word line to be electrically connected to the control gate; and the source line to be electrically connected to a second n-diffused region of the active region.

2. The method of claim 1, wherein the thin gate oxide has a thickness less than 75 angstroms.

3. The method of claim 1, wherein the thin gate oxide has a thickness between 65 and 75 angstroms.

4. The method of claim 3, wherein the thin gate oxide has a thickness of 70 angstroms.

5. The method of claim 1, wherein the memory cell is a one-time programmable device.

6. The method of claim 1, wherein the memory cell is a multiple-times programmable device.

7. The method of claim 6, wherein the multiple-times programmable device has a program and erase cycling endurance of less than 500 cycles.

8. The method of claim 1, further comprising:
    forming a deep n-well and a p-well in the substrate, the deep n-well and p-well to encompass the first and second diffused regions.

9. The method of claim 1, wherein the second polysilicon layer comprises two control gates, each of the control gates substantially situated above ends of the floating gate.

10. The method of clam 1, wherein the first metal layer further comprises a plurality of landing pads with a first landing pad between the word line and control gate, and a second landing pad between the source line and active region.

11. The method of claim 1, wherein the active region has an L shape from a first view above the substrate.

12. The method of claim 1, wherein the active region has a transposed-L shape from a first view above the substrate.

13. The method of claim 1, wherein the floating gate has a dumbbell shape with larger ends of the dumbbell shape situated below control gates of the second polysilicon layer.

14. A memory device comprising:
    an active region comprising a rectangular shape;
    a thin oxide layer over a substrate;
    a first polysilicon layer comprising a floating gate being a substantially rectangular area, a longer portion of the rectangular shape of the active region being substantially perpendicular to the floating gate;
    a second polysilicon layer comprising a control gate;
    a first metal layer comprising a bit line being electrically connected to a first n-diffused region of the active region, the bit line being substantially perpendicular to the floating gate; and
    the second metal layer comprising a word line and source line, the word line being electrically connected to the control gate; and the source line being electrically connected to a second n-diffused region of the active region.

15. The memory device of claim 14, wherein the thin gate oxide has a thickness between 65 and 75 angstroms.

16. The memory device of claim 14, wherein the thin gate oxide has a thickness of 70 angstroms.

17. The memory device of claim 14, wherein the active region has a transposed-L-shape.

* * * * *